United States Patent
Mizota et al.

(10) Patent No.: US 9,192,878 B2
(45) Date of Patent: Nov. 24, 2015

(54) LIQUID PROCESSING APPARATUS

(71) Applicant: Tokyo Electron Limited, Tokyo (JP)

(72) Inventors: Shogo Mizota, Koshi (JP); Takashi Yabuta, Koshi (JP); Tatsuya Nagamatsu, Koshi (JP); Daisuke Saiki, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 91 days.

(21) Appl. No.: 14/141,605

(22) Filed: Dec. 27, 2013

(65) Prior Publication Data

US 2014/0182455 A1 Jul. 3, 2014

(30) Foreign Application Priority Data

Dec. 28, 2012 (JP) .................. 2012-288725

(51) Int. Cl.
*B01D 19/00* (2006.01)
*H01L 21/67* (2006.01)

(52) U.S. Cl.
CPC ....... *B01D 19/0005* (2013.01); *H01L 21/67023* (2013.01)

(58) Field of Classification Search
CPC .............. B01D 57/00; H01L 21/67017; H01L 21/67023; H01L 21/67051; G03F 7/162
USPC ............. 134/93, 109, 110, 102.2, 102.3, 105, 134/34, 184; 210/97, 808, 141
See application file for complete search history.

(56) References Cited

U.S. PATENT DOCUMENTS

| | | | |
|---|---|---|---|
| 2003/0034056 A1* | 2/2003 | Amai et al. ..................... | 134/93 |
| 2010/0108103 A1* | 5/2010 | Minami et al. .................. | 134/26 |
| 2010/0200547 A1* | 8/2010 | Higashijima et al. ........... | 216/92 |
| 2011/0132465 A1* | 6/2011 | Eshima ............................. | 137/2 |
| 2012/0181239 A1* | 7/2012 | Furusho et al. ................ | 210/808 |
| 2013/0078381 A1* | 3/2013 | Miyagi et al. .................. | 427/345 |
| 2013/0306238 A1* | 11/2013 | Miura et al. ............. | 156/345.11 |
| 2013/0333722 A1* | 12/2013 | Tanaka .............................. | 134/1 |
| 2014/0034584 A1* | 2/2014 | Marumoto et al. ........... | 210/808 |
| 2014/0097147 A1* | 4/2014 | Yoshida et al. ............... | 210/808 |
| 2015/0107622 A1* | 4/2015 | Takaki et al. ................... | 134/10 |

FOREIGN PATENT DOCUMENTS

| JP | 2004-267965 A | 9/2004 |
|---|---|---|
| JP | 2006-269668 A | 10/2006 |

* cited by examiner

*Primary Examiner* — Duane Smith
*Assistant Examiner* — Minh-Chau Pham
(74) *Attorney, Agent, or Firm* — Pearne & Gordon LLP

(57) ABSTRACT

A liquid processing apparatus and a chemical liquid collecting method can suppress corrosion of wirings formed on a substrate. The liquid processing apparatus includes a processing unit configured to perform a liquid process by supplying a chemical liquid to a substrate; a collecting line configured to collect the chemical liquid supplied to the processing unit; a supply line configured to supply the collected chemical liquid to the processing unit; and a gas supply unit configured to supply an inert gas into the collecting line.

13 Claims, 7 Drawing Sheets

1

LIQUID PROCESSING APPARATUS

CROSS-REFERENCE TO RELATED APPLICATION

This application claims the benefit of Japanese Patent Application No. 2012-288725 filed on Dec. 28, 2012, the disclosures of which are incorporated herein by reference.

TECHNICAL FIELD

The embodiments described herein pertain generally to a liquid processing apparatus and a chemical liquid collecting method.

BACKGROUND

Conventionally, there has been known a liquid processing apparatus that supplies a chemical liquid to a substrate such as a semiconductor wafer or a glass substrate and performs a liquid process thereon.

By way of example, a liquid processing apparatus described in Patent Document 1 includes a chemical liquid tank configured to store a chemical liquid, a spin chuck configured to be rotated while holding a substrate as a target to be processed, and a supply line configured to supply the chemical liquid from the chemical liquid tank to the substrate on the spin chuck.

Further, recently, there has been known a liquid processing apparatus including a collecting line configured to collect a chemical liquid supplied to a substrate and return it back to a chemical liquid tank to reuse the chemical liquid.

Patent Document 1: Japanese Patent Laid-open Publication No. 2006-269668

However, while a chemical liquid supplied to a substrate is collected and supplied to another substrate, the chemical liquid is exposed to air and oxygen is dissolved in the chemical liquid. Thus, wirings formed of metals such as copper on the substrate may be oxidized and corroded by the oxygen in the chemical liquid.

SUMMARY

In view of the foregoing problems, example embodiments provide a liquid processing apparatus and a chemical liquid collecting method capable of suppressing corrosion of wirings formed on a substrate.

In one example embodiment, a liquid processing apparatus includes a processing unit configured to perform a liquid process by supplying a chemical liquid to a substrate; a collecting line configured to collect the chemical liquid supplied to the processing unit; a supply line configured to supply the collected chemical liquid to the processing unit; and a gas supply unit configured to supply an inert gas into the collecting line.

According to an example embodiment, it is possible to suppress corrosion of wirings formed on a substrate. The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

First Example Embodiment

Figure 1:
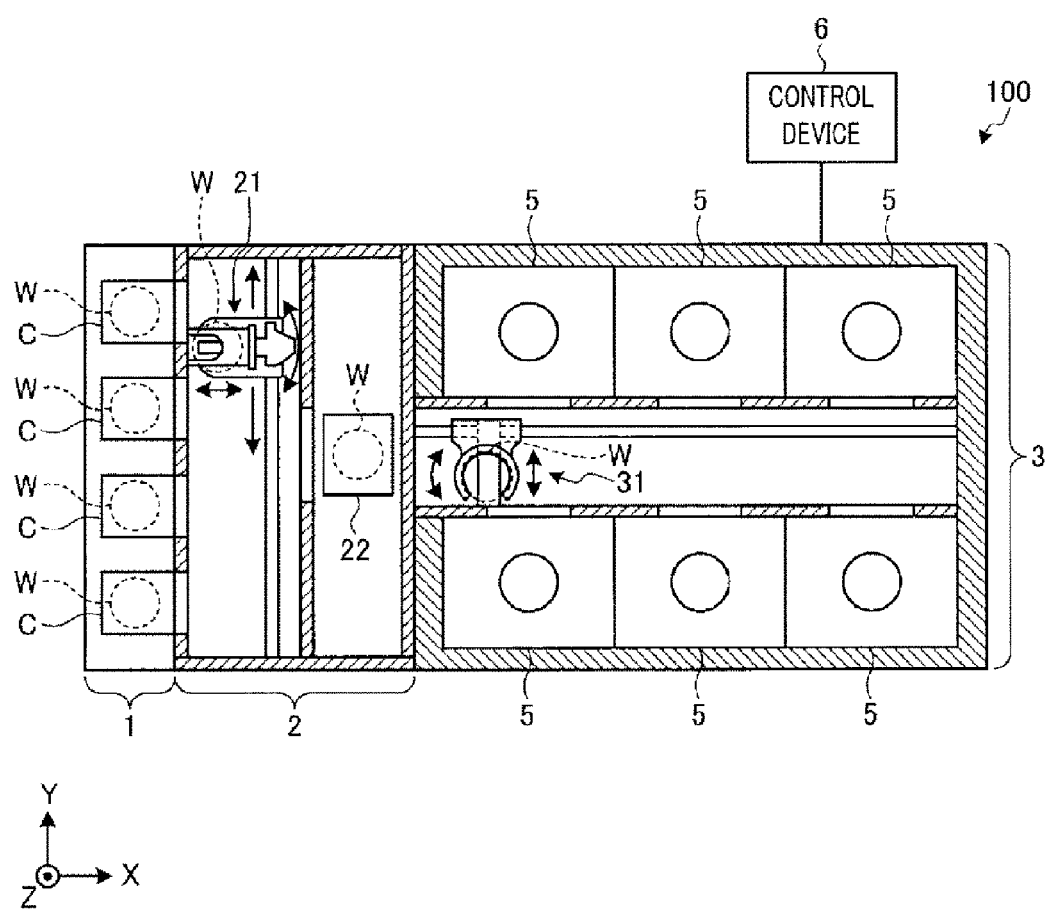
FIG. 1 is a schematic diagram illustrating a configuration of a liquid processing apparatus in accordance with a first example embodiment.

Hereinafter, a liquid processing apparatus and a chemical liquid collecting method in accordance with an example embodiment will be explained in detail with reference to accompanying drawings. In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example. Still, the examples described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Referring to FIG. 1, there will be explained a schematic configuration of a liquid processing apparatus in accordance with the present example embodiment. Further, hereinafter, for the clarity of positional relationship, X-, Y-, and Z-axes perpendicular to one another will be defined, and a positive direction of the Z-axis will be defined as a vertically upward direction. Furthermore, hereinafter, a negative direction of the X-axis will be defined as a front direction, and a positive direction of the X-axis will be defined as a back direction of the liquid processing apparatus.

As depicted in FIG. 1, a liquid processing apparatus 100 includes a loading/unloading station 1, a transfer station 2, and a process station 3. The loading/unloading station 1, the transfer station 2, and the process station 3 are arranged in sequence from the front side to the back side of the liquid processing apparatus 100.

The loading/unloading station 1 serves as a place on which a carrier C that accommodates multiple sheets (for example, 25 sheets) of a wafer W in a horizontal state is mounted. By way of example, four carriers C are arranged and mounted laterally while being in close contact with a front wall of the transfer station 2.

The transfer station 2 is arranged at the back of the loading/unloading station 1, and includes a substrate transfer device 21 and a substrate transfer table 22 therein. The transfer station 2 is configured to transfer the wafer W between the carrier C mounted on the loading/unloading station 1 and the substrate transfer table 22.

The process station 3 is arranged at the back of the transfer station 2. At a central area of the process station 3, a substrate transfer device 31 is provided, and on each of both sides of the substrate transfer device 31, multiple (herein, three) processing units 5 are arranged. In the process station 3, the substrate transfer device 31 transfers each wafer W between the substrate transfer table 22 of the transfer station 2 and each of the processing units 5, and each of the processing units 5 performs a liquid process on each wafer W.

In accordance with the first example embodiment, the processing unit 5 serves as a cleaning device configured to supply a chemical liquid to the wafer W and clean the wafer W. A configuration of the processing unit 5 will be explained with reference to FIG. 3.

Further, the processing unit 5 is not limited to the cleaning device but just needs to supply a chemical liquid to the wafer W and perform a liquid process thereon.

The liquid processing apparatus 100 includes a control device 6. By way of example, the control device 6 may be a computer and includes non-illustrated control unit and storage unit. The storage unit stores a program for controlling various processes such as a substrate cleaning process and the like. The control unit controls an overall operation of the liquid processing apparatus 100 by reading and executing the program stored in the storage unit.

Further, the program may be recorded in a computer-readable storage medium from which the program may be installed in the storage unit of the control device 6. The computer-readable storage medium may include, for example, a hard disk (HD), a flexible disk (FD), a compact disk (CD), a magneto-optical (MO) disk, and a memory card.

Although the control device 6 is illustrated in FIG. 1 as being provided outside the liquid processing apparatus 100 for convenience, the control device 6 may be provided inside the liquid processing apparatus 100. By way of example, the control device 6 may be accommodated in an upper space of the processing unit 5.

In the liquid processing apparatus 100 configured as described above, the substrate transfer device 21 of the transfer station 2 unloads one sheet of the wafer W from the carrier C mounted on the loading/unloading station 1 and mounts the unloaded wafer W on the substrate transfer table 22. The wafer W mounted on the substrate transfer table 22 is transferred by the substrate transfer device 31 of the process station 3 and loaded into any one of the processing units 5.

After a cleaning process is performed on the wafer W loaded into the processing unit 5 in the processing unit 5, the wafer W is unloaded from the processing unit 5 by the substrate transfer device 31 and mounted on the substrate transfer table 22. Further, the processed wafer W mounted on the substrate transfer table 22 is returned to the carrier C by the substrate transfer device 21.

The processing unit 5 is connected to a supply line and a collecting line for a chemical liquid. The processing unit 5 supplies a chemical liquid supplied through the supply line to the wafer W. Then, the chemical liquid supplied to the wafer W is collected through the collecting line. Further, a chemical liquid (unused chemical liquid) supplied first to the wafer W is not mixed with oxygen.

Figure 2:
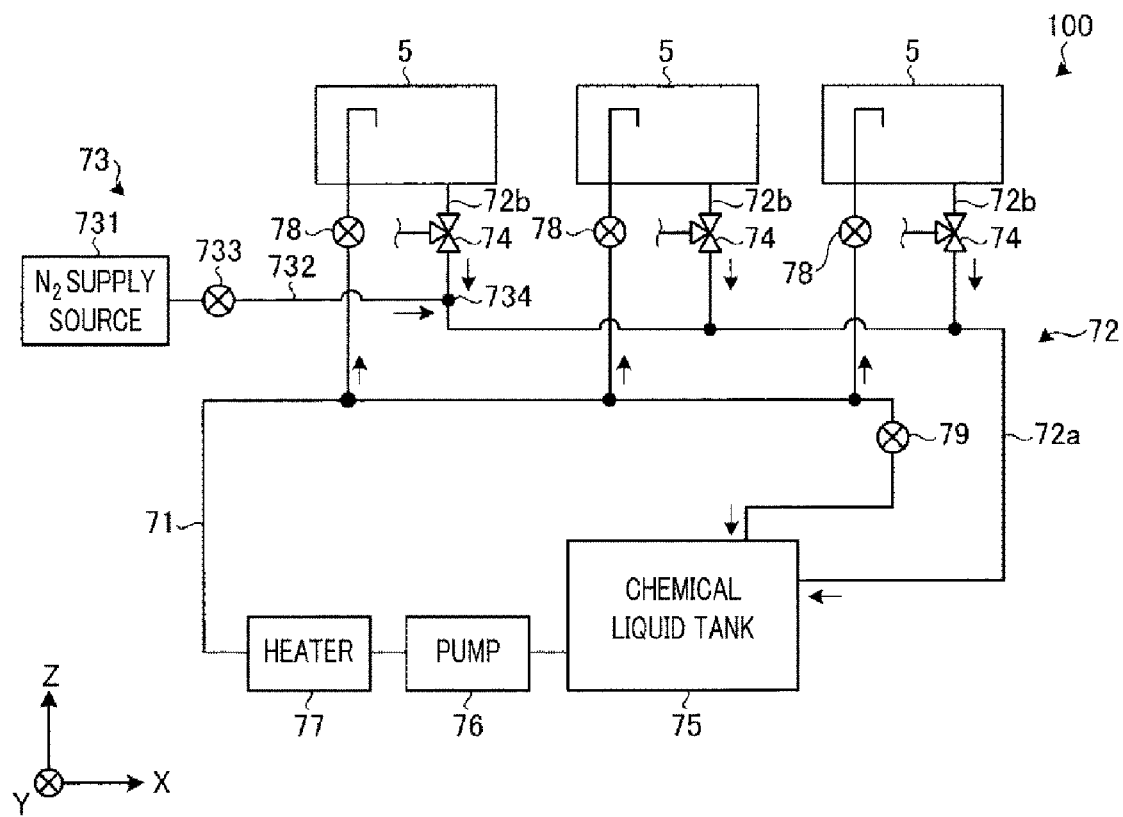
FIG. 2 is a schematic diagram illustrating arrangement of lines of a processing unit.

Hereinafter, arrangement of lines of the processing unit 5 will be explained in detail with reference to FIG. 2. FIG. 2 is a schematic diagram illustrating arrangement of lines of the processing unit 5. Further, lines or a chemical liquid tank depicted in FIG. 2 may be accommodated in, for example, a lower space of the processing unit 5.

As depicted in FIG. 2, the liquid processing apparatus 100 includes a supply line 71, a collecting line 72, and a gas supply unit 73. Further, the liquid processing apparatus 100 includes switching valves 74, a chemical liquid tank 75, a pump 76, a heater 77, flow rate control devices 78, and a constant pressure valve 79.

A chemical liquid supply system will be explained first. The supply line 71 is a line through which a chemical liquid is supplied to the processing unit 5.

Both ends of the supply line 71 are connected to the chemical liquid tank 75. A circulation path of the chemical liquid is formed by the supply line 71 and the chemical liquid tank 75. Further, multiple branch lines branched from the circulation path are connected to the processing units 5, respectively. Each branch line includes the flow rate control device 78, and the control device 6 controls opening/closing of the flow rate control devices 78 and a flow rate of the chemical liquid, so that a supply of the chemical liquid to the processing unit 5 can be controlled. Further, the flow rate control device 78 includes at least a valve.

The supply line 71 includes the pump 76 and the heater 77. The pump 76 is configured to pump a chemical liquid stored in the chemical liquid tank 75 to allow the chemical liquid to flow toward a downstream side of the supply line 71. The heater 77 is configured to heat the chemical liquid flowing in the supply line 71. Although the heater 77 is illustrated as being provided at the supply line 71 herein, the heater 77 may be provided at the chemical liquid tank 75.

The chemical liquid stored in the chemical liquid tank 75 is circulated through the circulation path by the pump 76 and is supplied to the respective processing units 5 through the branch lines branched from the circulation path. Further, the inside of the circulation path is filled with the chemical liquid.

Further, at a more downstream side of the supply line 71 than all of the processing units 5, the constant pressure valve 79 configured to constantly maintain an internal pressure of the supply line 71 is provided. Thus, regardless of whether each flow rate control device 78 is opened or closed, the inside of the supply line 71 can be maintained at a constant pressure.

The supply line 71 is also connected to the other three processing units 5 included in the liquid processing apparatus 100, but illustration thereof will be omitted herein.

Hereinafter, a chemical liquid collecting system will be explained. The collecting line 72 is a line through which the chemical liquid supplied to the processing units 5 is collected to be returned back to the chemical liquid tank 75. The collecting line 72 includes a main line 72a and multiple branched lines 72b. A downstream end portion of the main line 72a is connected to the chemical liquid tank 75, and the multiple branched lines 72b are connected to the processing units 5, respectively. Further, the main line 72a has a portion horizontally extended along the arrangement direction of the processing units 5, and each of the multiple branched lines 72b is connected to this portion.

Each switching valve 74 is provided on the branch line 72b. The switching valve 74 is configured to selectively connect the collecting line 72 and a liquid drain line for draining a waste liquid to an outside of the liquid processing apparatus 100. Since the switch valves 74 are provided, it is possible to suppress oxygen from being introduced into the collecting line 72 while the processing units 5 do not perform processes. Opening/closing of the switching valves 74 is controlled by the control device 6. The waste liquid drained from the liquid drain line may be, for example, another chemical liquid supplied to the processing units 5 through another non-illustrated supply path or may be the chemical liquid from the chemical liquid tank 75.

The chemical liquid supplied to the processing units 5 through the supply line 71 is returned to the chemical liquid tank 75 through the collecting line 72. Then, the chemical liquid returned to the chemical liquid tank 75 is supplied again to the processing units 5 through the supply line 71.

Figure 3:
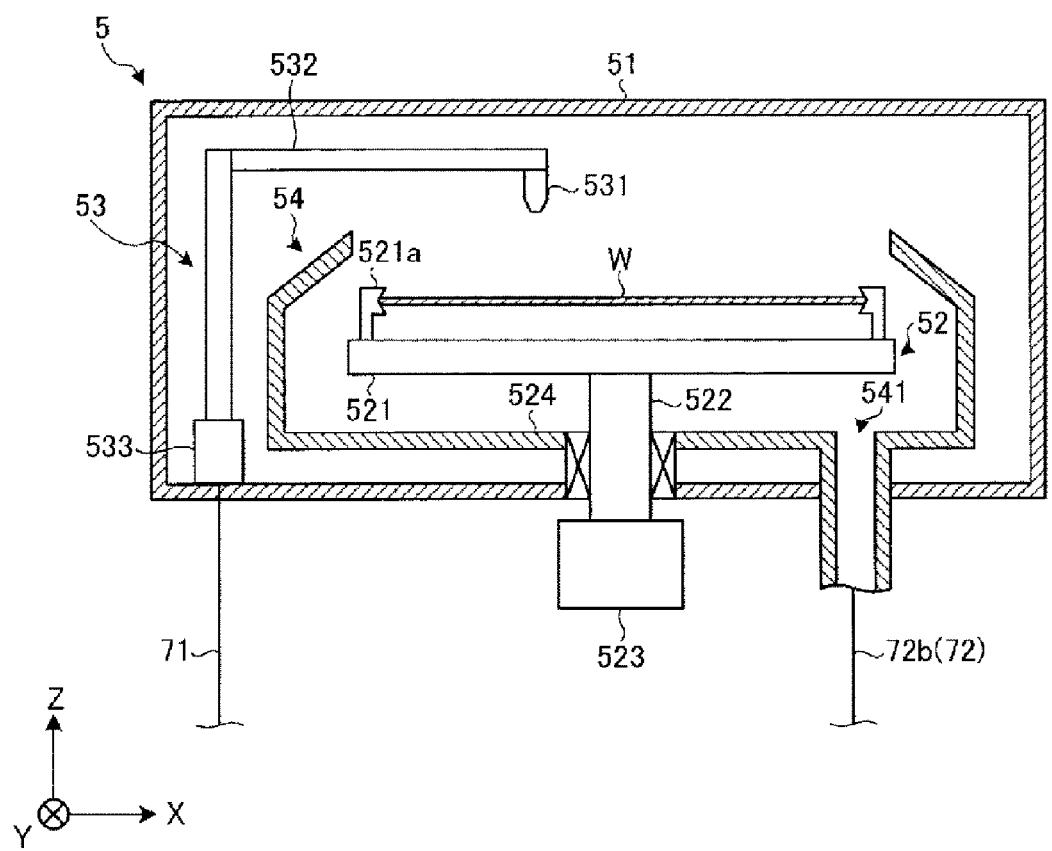
FIG. 3 is a schematic diagram illustrating a configuration of the processing unit.

Hereinafter, a connection relationship among the supply line 71, the collecting line 72, and the processing units 5 will be explained in detail with reference to FIG. 3. FIG. 3 is a schematic diagram illustrating a configuration of the processing unit 5. FIG. 3 just illustrates components required to explain features of the processing unit 5, and illustration of other typical components is omitted.

As depicted in FIG. 3, the processing unit 5 includes a substrate holding unit 52, a liquid supply unit 53, and a collecting cup 54 within a chamber 51.

The substrate holding unit 52 includes a rotating and holding device 521 configured to hold the wafer W to be rotatable, a supporting column member 522 configured to support the rotating and holding device 521, and a driving unit 523 configured to rotate the supporting column member 522 around a vertical axis.

The rotating and holding device 521 is provided at a substantially central area in the chamber 51. On a top surface of the rotating and holding device 521, there is provided a grip portion 521a for gripping a periphery portion of the wafer W. The wafer W is horizontally held by the grip portion 521a while being slightly spaced from the top surface of the rotating and holding device 521.

The supporting column member 522 is provided under rotating and holding device 521 and supported to be rotatable by the chamber 51 and the collecting cup 54 via a bearing 524.

The driving unit 523 is provided under the supporting column member 522 and configured to rotate the supporting column member 522 around the vertical axis. Thus, the wafer W held on the rotating and holding device 521 is rotated.

The liquid supply unit 53 includes a nozzle 531 configured to discharge a chemical liquid, an arm 532 configured to horizontally support the nozzle 531, and a rotation elevating device 533 configured to rotate and elevate the arm 532.

The above-described supply line 71 is connected to the liquid supply unit 53. That is, the chemical liquid stored in the chemical liquid tank 75 is supplied to the liquid supply unit 53 through the supply line 71, and then, supplied to a main surface of the wafer W through the nozzle 531 of the liquid supply unit 53.

The collecting cup 54 is provided to surround the substrate holding unit 52 and is configured to suppress the chemical liquid from being scattered to the vicinity. At a bottom portion of the collecting cup 54, a liquid drain opening 541 is formed.

The above-described collecting line 72 is connected to the liquid drain opening 541. That is, the chemical liquid collected by the collecting cup 54 is introduced into the collecting line 72 through the liquid drain opening 541, and then, returned to the chemical liquid tank 75 through the collecting line 72.

However, in a conventional liquid processing apparatus, while a chemical liquid is returned to a chemical liquid tank through a collecting line, the chemical liquid is exposed to air in the collecting line, and, thus, oxygen is dissolved in the chemical liquid. If the chemical liquid containing the oxygen dissolved therein is allowed to flow into a supply line and supplied to a substrate, metals such as copper forming wirings formed on the substrate may be oxidized by the oxygen dissolved in the chemical liquid and the wirings may be corroded.

Therefore, in the liquid processing apparatus 100 in accordance with the first example embodiment, as depicted in FIG. 2, the gas supply unit 73 is provided at the collecting line 72 and an inert gas is supplied into the collecting line 72 from the gas supply unit 73. Since the inert gas is supplied into the collecting line 72, an oxygen concentration within the collecting line 72 can be lowered. Therefore, it is possible to reduce an amount of oxygen to be dissolved in the chemical liquid in the collecting line 72.

Thus, even if the collected chemical liquid is supplied again to the wafer W, wirings formed on the wafer W may not be easily oxidized. Therefore, it is possible to suppress corrosion of the wirings.

The gas supply unit 73 includes a $N_2$ supply source 731, a line 732, and a flow rate control device 733 provided at a portion of the line 732. A base end of the line 732 is connected to the $N_2$ supply source 731 and a leading end thereof is connected to the collecting line 72. The flow rate control device 733 includes at least a valve. Further, the control device 6 controls opening/closing of the flow rate control device 733 and a flow rate of the nitrogen, so that a supply of the nitrogen to collecting line 72 can be controlled.

Unlike the supply line 71, the inside of the collecting line 72 is not filled with the chemical liquid. Therefore, the nitrogen as an inert gas supplied from the gas supply unit 73 into the collecting line 72 is diffused within the collecting line 72, and, thus, the oxygen concentration within the collecting line 72 can be lowered.

Desirably, a connecting portion 734 between the line 732 of the gas supply unit 73 and the collecting line 72 may be provided at a more downstream side of the collecting line 72 than the switching valves 74. Thus, internal pressures of the processing units 5 can be easily controlled as compared with a case where the connecting portion 734 is provided at a more upstream side of the collecting line 72 than the switching valves 74.

Further, the control device 6 may control a flow rate of the nitrogen depending on a flow rate of the chemical liquid. To be specific, the control device 6 controls the flow rate control device 733 to increase an opening/closing degree of the flow rate control device 733 according to an increase in the number of the switching valves 74 switched to the collecting line 72. Thus, it is possible to decrease a supplying amount of the nitrogen to be low.

Furthermore, desirably, the connecting portion 734 between the line 732 of the gas supply unit 73 and the collecting line 72 may be provided at a more downstream side of the main line 72a than the switching valve 74 provided at the branch line 72b connected at the most upstream side of the main line 72a. To be more specific, as depicted in FIG. 2, desirably, the connecting portion 734 may be provided between the switching valve 74 provided at the branch line 72b connected at the most upstream side of the main line 72a and a switching valve 74 provided at a branch line 72b connected at a downstream side next to this branch line 72b.

Since the connecting portion 734 is provided at the more downstream side of the main line 72a than the switching valves 74 and as close to the upstream side of the main line 72a as possible, the nitrogen supplied from the gas supply unit 73 can be diffused efficiently within the collecting line 72.

Further, a position of the connecting portion 734 is not limited to the above-described position. By way of example, the connecting portion 734 may be provided at a central portion in a longitudinal direction of the main line 72a or may be provided in the vicinity of a downstream end portion (a connecting portion with the chemical liquid tank 75) of the main line 72a.

The liquid processing apparatus 100 further includes one more set of the collecting line 72, the gas supply unit 73, and the switching valves 74 as a chemical liquid collecting system for the other three processing units 5. Further, another non-illustrated collecting line 72 is connected to the chemical liquid tank 75 depicted in FIG. 2. The liquid processing apparatus 100 includes one chemical liquid supply system and two chemical liquid collecting systems with respect to six processing units 5 (see FIG. 1).

Figure 4A:
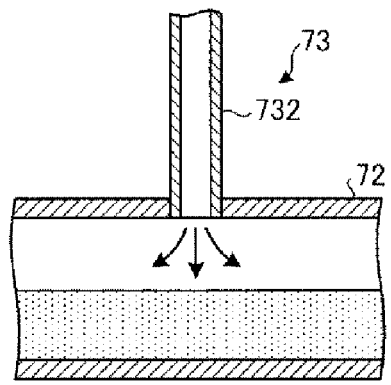
FIG. 4A is a schematic diagram illustrating a configuration example of a connecting portion.

Hereinafter, configuration examples of the connecting portion 734 between the line 732 of the gas supply unit 73 and the collecting line 72 will be explained with reference to FIG. 4A to FIG. 4C. FIG. 4A is a schematic diagram illustrating a configuration example of the connecting portion 734, and FIG. 4B and FIG. 4C are schematic diagrams illustrating other configuration examples of the connecting portion 734.

As depicted in FIG. 4A, the line 732 of the gas supply unit 73 may be connected to the collecting line 72 such that the line 732 is not protruded and more specifically, a leading end of the line 732 is positioned at substantially the same line with an inner peripheral surface of the collecting line 72. Thus, with a relatively simple configuration, nitrogen can be supplied into the collecting line 72 and oxygen in the chemical liquid can be removed effectively.

Figure 4B:
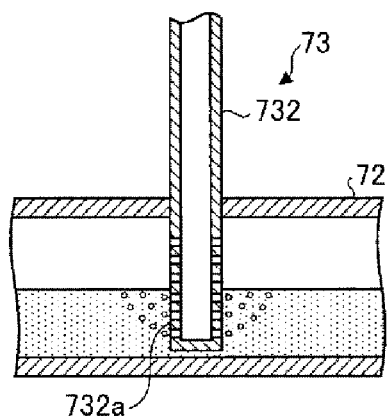
FIG. 4B is a schematic diagram illustrating another configuration example of the connecting portion.
Figure 4C:
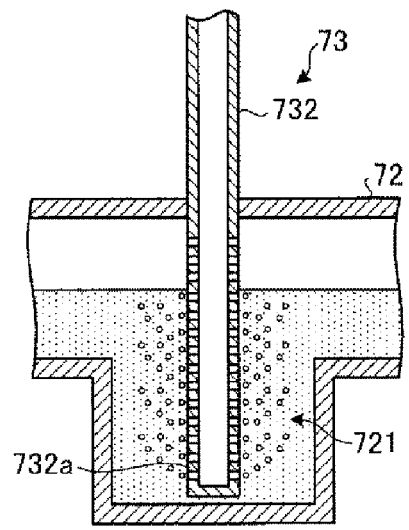
FIG. 4C is a schematic diagram illustrating still another configuration example of the connecting portion.

Further, as depicted in FIG. 4B, the line 732 may be connected to the collecting line 72 such that the leading end of the line 732 is submerged in the chemical liquid within the collecting line 72. Thus, nitrogen supplied through the line 732 is supplied into the collecting line 72 via the chemical liquid. Therefore, oxygen in the chemical liquid is removed by a degassing reaction in which the oxygen is pushed out by the nitrogen, so that the oxygen concentration within the collecting line 72 can be lowered.

In this case, the leading end of the line 732 may include multiple holes 732a. Thus, nitrogen in the form of bubbles can be supplied into the chemical liquid through the holes 732a. Therefore, oxygen in the chemical liquid can be removed more effectively.

Furthermore, as depicted in FIG. 4C, a liquid recess portion 721 may be formed at the collecting line 72, and the leading end of the line 732 may be positioned within the liquid recess portion 721. Thus, the leading end of the line 732 can be further submerged in the chemical liquid. Therefore, a degassing effect can be further improved.

Figure 5:
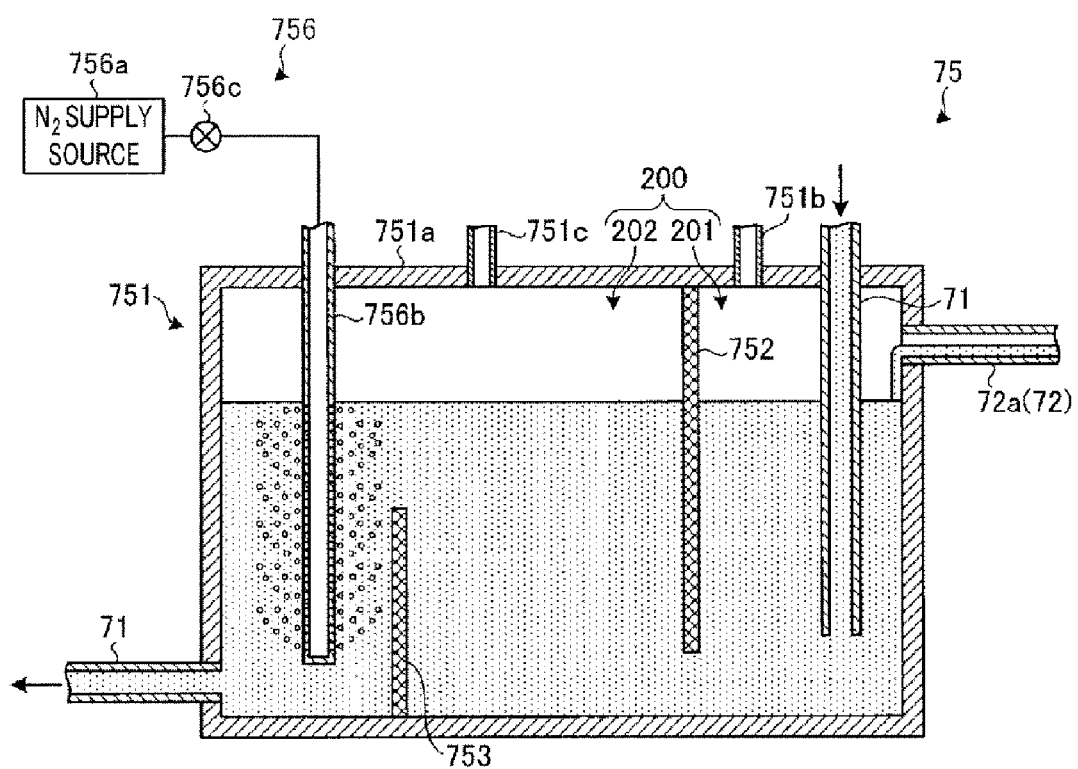
FIG. 5 is a schematic diagram illustrating a configuration of a chemical liquid tank.

Hereinafter, a configuration of the chemical liquid tank 75 depicted in FIG. 2 will be explained with reference to FIG. 5. FIG. 5 is a schematic diagram illustrating a configuration of the chemical liquid tank 75.

As depicted in FIG. 5, the chemical liquid tank 75 includes a box-shaped main body 751 including a ceiling 751a and a partition plate 752 provided at the ceiling 751a of the main body 751. By the partition plate 752, a space 200 between the chemical liquid stored in the main body 751 and the ceiling 751a is partitioned into a first space 201 and a second space 202. Further, since the partition plate 752 is provided, a flow path length of the chemical liquid in the main body 751 can be lengthened.

Further, the main body 751 includes a first exhaust opening 751b on the ceiling 751a at the first space 201's side and a second exhaust opening 751c on the ceiling 751a at the second space 202's side. Each of the exhaust openings 751b and 751c is connected to a non-illustrated exhausting device. At a bottom portion of the main body 751, a partition plate 753 for lengthening the flow path length of the chemical liquid in the main body 751 is provided.

The chemical liquid tank 75 further includes a degassing unit 756. The degassing unit 756 includes a $N_2$ supply source 756a, a line 756b, and a flow rate control device 756c provided at a portion of the line 756b. A base end of the line 756b is connected to the $N_2$ supply source 756a and a leading end thereof is submerged in the chemical liquid under the second space 202. The flow rate control device 756c includes at least a valve. Further, the control device 6 controls opening/closing of the flow rate control device 756c and a flow rate of the nitrogen, so that the nitrogen can be supplied into the chemical liquid under the second space 202. Thus, oxygen dissolved in the chemical liquid can be removed by a degassing reaction.

Although the leading end of the line 756b includes multiple holes in FIG. 5, a form of the leading end of the line 756b is not limited to the above-described form.

The control device 6 may control a flow rate of the nitrogen depending on a measurement result of a dissolved oxygen monitoring device configured to measure an amount of the dissolved oxygen in the chemical liquid. To be specific, the control device 6 controls the flow rate control device 756c to increase the supplying amount of nitrogen according to an increase in amount of dissolved oxygen in the chemical liquid. Thus, it is possible to reduce the supplying amount of the nitrogen. Further, the dissolved oxygen monitoring device may be provided, for example, between the pump 76 and the heater 77 connected to the supply line 71 or at the chemical liquid tank 75.

In the chemical liquid tank 75 configured as described above, a downstream end portion of the collecting line 72 communicates with the first space 201 and an upstream end portion of the supply line 71 communicates with a lower portion of the second space 202.

Herein, the second space 202 is set in a nitrogen atmosphere by the nitrogen supplied from the degassing unit 756. Meanwhile, the first space 201 is set approximately in a substantial nitrogen atmosphere by the nitrogen introduced from the collecting line 72. However, since the inside of the collecting line 72 is not completely in the nitrogen atmosphere, a little amount of oxygen may exist in the first space 201. The nitrogen atmosphere mixed with the oxygen can be exhausted to the outside through the first exhaust opening 751b in the chemical liquid tank 75.

Further, since the space 200 is partitioned into the first space 201 and the second space 202 by the partition plate 752, it is possible to avoid introduction of the oxygen existing in the first space 201 into the second space 202. Thus, it is possible to reduce an amount of oxygen dissolved in the chemical liquid within the chemical liquid tank 75.

In view of the foregoing, desirably, the partition plate 752 may be provided such that the first space 201 becomes smaller than the second space 202.

A downstream end portion of the supply line 71 is submerged into the chemical liquid under the first space 201.

Thus, it is possible to obtain a flow path through which the chemical liquid returning from the downstream end portion of the supply line 71 to the chemical liquid tank 75 is introduced into the upstream end portion of the supply line 71, and also possible to avoid a contact between the chemical liquid returning from the downstream end portion of the supply line 71 to the chemical liquid tank 75 and the oxygen within the first space 201.

As described above, the liquid processing apparatus 100 in accordance with the first example embodiment includes the processing units 5, the collecting line 72, the supply line 71, and the gas supply unit 73. The processing units 5 are configured to supply the chemical liquid to the wafers W to perform liquid processes on the wafers W. The collecting line 72 is configured to collect the chemical liquid supplied to the processing units 5. The supply line 71 is configured to supply the collected chemical liquid to the processing units 5. The gas supply unit 73 is configured to supply nitrogen as an inert gas into the collecting line 72. Therefore, according to the liquid processing apparatus 100 in accordance with the first example embodiment, it is possible to suppress corrosion of the wirings formed on the wafer W.

Figure 6:
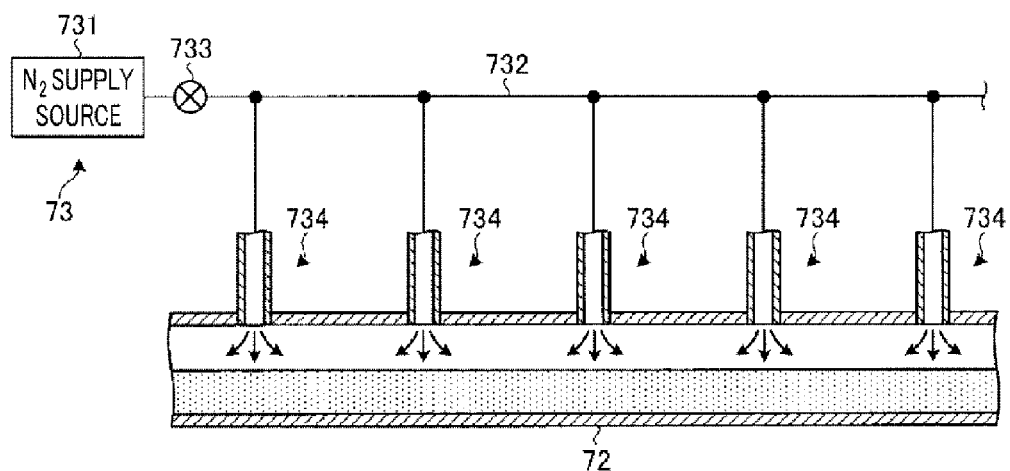
FIG. 6 is a schematic diagram illustrating a modification example of a gas supply unit.
Figure 7:
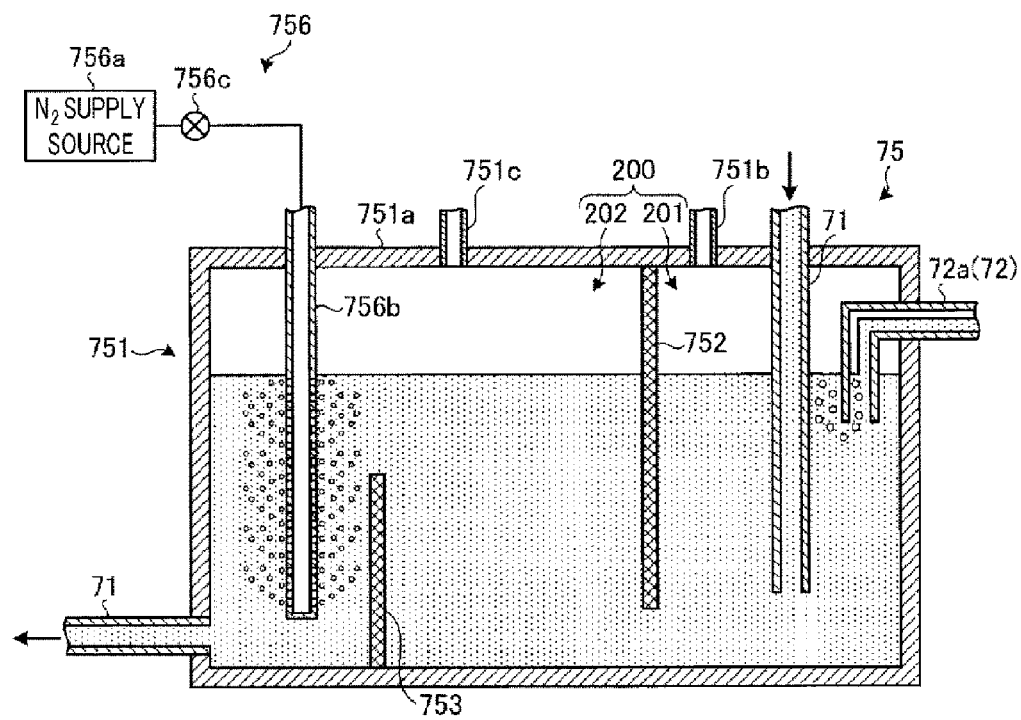
FIG. 7 is a schematic diagram illustrating a modification example of a downstream end portion of a collecting line.

Hereinafter, a modification example of the first example embodiment will be explained with reference to FIG. 6 and FIG. 7. FIG. 6 is a schematic diagram illustrating a modification example of the gas supply unit 73. Further, FIG. 7 is a schematic diagram illustrating a modification example of the downstream end portion of the collecting line 72.

The above-described first example embodiment shows a case where the connecting portion 734 between the line 732 of the gas supply unit 73 and the collecting line 72 is provided at only one position as depicted in FIG. 2. However, the number of the connecting portion 734 is not limited thereto.

By way of example, as depicted in FIG. 6, the connecting portion 734 may be provided at multiple positions along a flow direction of the collecting line 72.

Since nitrogen is supplied from the multiple positions along the flow direction of the collecting line 72, the nitrogen can be diffused uniformly within the collecting line 72. Thus, it is possible to suppress a portion having a locally high oxygen concentration from being formed within the collecting line 72. Therefore, the oxygen concentration within the collecting line 72 can be lowered more effectively.

Although the connecting portion 734 is illustrated as having the configuration depicted in FIG. 4A, the connecting portion 734 may have the configuration depicted in FIG. 4B or FIG. 4C.

Further, the above-described first example embodiment shows a case where the downstream end portion of the collecting line 72 communicates with the first space 201. However, it is not limited thereto.

By way of example, as depicted in FIG. 7, the downstream end portion of the collecting line 72 may communicate with the chemical liquid under the first space 201. Thus, oxygen dissolved in the chemical liquid within the chemical liquid tank 75 can be removed by using nitrogen introduced from the collecting line 72.

Second Example Embodiment

Figure 8:
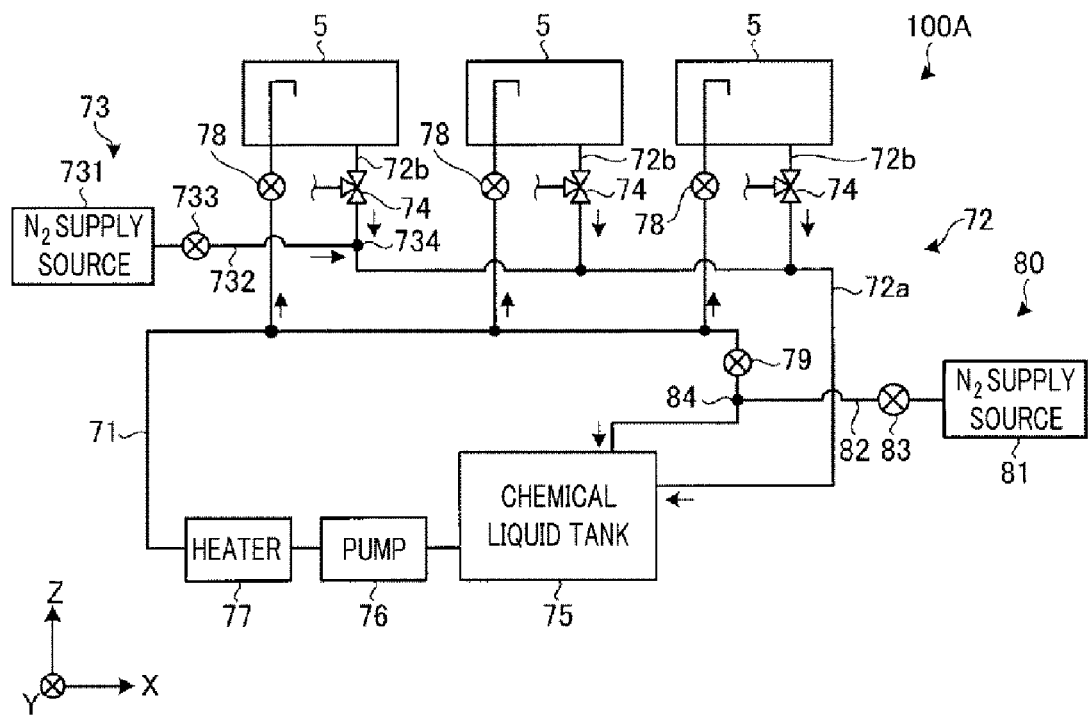
FIG. 8 is a schematic diagram illustrating arrangement of lines of a processing unit in accordance with a second example embodiment.
Figure 9:
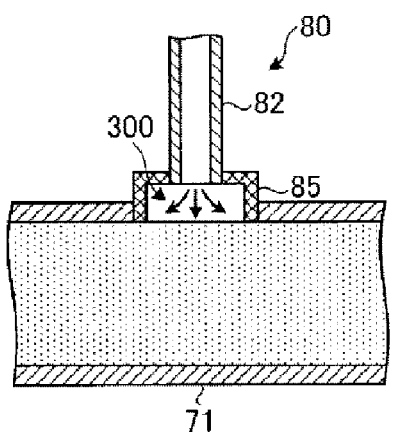
FIG. 9 is a schematic diagram illustrating a configuration example of a degassing unit.

Hereinafter, a second example embodiment will be explained with reference to FIG. 8 and FIG. 9. FIG. 8 is a schematic diagram illustrating arrangement of lines of a processing unit in accordance with the second example embodiment. Further, FIG. 9 is a schematic diagram illustrating a configuration example of a degassing unit. Hereinafter, components similar or corresponding to those of the above-described example embodiment will be assigned similar reference numerals, and redundant descriptions thereof will be omitted.

As depicted in FIG. 8, a liquid processing apparatus 100A in accordance with the second example embodiment further includes a degassing unit 80 in addition to the components included in the liquid processing apparatus 100 in accordance with the first example embodiment.

The degassing unit 80 includes a $N_2$ supply source 81, a line 82, and a flow rate control device 83 provided at a portion of the line 82. A base end of the line 82 is connected to the $N_2$ supply source 81 and a leading end thereof is connected to the supply line 71. The flow rate control device 83 includes at least a valve. Further, the control device 6 controls opening/closing of the flow rate control device 83 and a flow rate of nitrogen, so that a supply of the nitrogen to supply line 71 can be controlled.

As depicted in FIG. 9, the line 82 of the degassing unit 80 is connected to the supply line 71 via a connecting member 85 having a larger diameter than the line 82. By the connecting member 85, a space 300 is formed between the chemical liquid flowing in the supply line 71 and a leading end of the line 82. The nitrogen supplied through the line 82 is supplied into the supply line 71 through the space 300. Thus, the nitrogen can be supplied into the supply line 71 filled with the chemical liquid. Since the nitrogen flows in the supply line 71 to be supplied to the chemical liquid, oxygen dissolved in the chemical liquid flowing in the supply line 71 can be removed.

Further, a configuration of a connecting portion between the line 82 and the supply line 71 is not limited to the configuration depicted in FIG. 9, and the connecting portion may have the configuration depicted in FIG. 4B or FIG. 4C.

Desirably, a connecting portion 84 between the line 82 and the supply line 71 may be provided at a more downstream side of the supply line 71 than the constant pressure valve 79. Thus, since an effect of a pressure change can be suppressed, an internal pressure of the supply line 71 can be easily controlled.

As described above, the liquid processing apparatus 100A in accordance with the second example embodiment further includes the degassing unit 80 configured to remove oxygen dissolved in the chemical liquid within the supply line 71 by supplying nitrogen as an inert gas to the chemical liquid. Therefore, according to the liquid processing apparatus 100A in accordance with the second example embodiment, it is possible to further suppress corrosion of wirings formed on the wafer W.

Although each of the above-described example embodiments shows a case where nitrogen is used as an inert gas, other inert gases such as argon or the like may be used.

Although each of the above-described example embodiments shows a case where the supply line 71 and the collecting line 72 are connected to the multiple processing units 5, the supply line 71 and the collecting line 72 may be connected to the single processing unit 5.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A liquid processing apparatus comprising:
    at least one processing unit configured to perform a liquid process by supplying a chemical liquid to a substrate;

a reservoir configured to store the chemical liquid;

a supply line configured to supply the collected chemical liquid to the at least one processing unit;

a collecting line configured to collect the chemical liquid supplied to the at least one processing unit to return the chemical liquid back to the reservoir; and a gas supply unit configured to supply an inert gas into the collecting line, wherein the gas supply unit includes a gas supply pipe connected with the collecting line, and the inert gas is supplied to the chemical liquid in the collecting line thereby reducing an amount of oxygen to be dissolved in the chemical liquid in the collecting line, such that corrosion of wirings formed on the substrate by recirculated chemical liquid is suppressed.

2. The liquid processing apparatus of claim 1, further comprising:

a switching valve provided at a portion of the collecting line and configured to selectively connect the collecting line and a liquid drain line configured to drain a waste liquid to an outside, wherein the gas supply unit is provided at a more downstream side of the collecting line than the switching valve.

3. The liquid processing apparatus of claim 1, wherein an upstream end portion of the supply line and a downstream end portion of the collecting line are connect to the reservoir.

4. The liquid processing apparatus of claim 3, wherein the reservoir comprises:

a main body having a ceiling; and a partition plate configured to partition a space between the chemical liquid stored in the main body and the ceiling.

5. The liquid processing apparatus of claim 4, wherein the downstream end portion of the collecting line communicates with a first space of the space partitioned by the partition plate, and the upstream end portion of the supply line communicates with the chemical liquid under a second space of the space partitioned by the partition plate.

6. The liquid processing apparatus of claim 5, wherein a downstream end portion of the supply line is connected to the reservoir, and the downstream end portion of the supply line is provided within the chemical liquid under the first space.

7. The liquid processing apparatus of claim 4, wherein the reservoir comprises:

a first exhaust opening that communicates with the first space of the space partitioned by the partition plate; and a second exhaust opening that communicates with the second space of the space partitioned by the partition plate.

8. The liquid processing apparatus of claim 1, further comprising:

a degassing unit configured to remove oxygen dissolved in the chemical liquid by supplying an inert gas into the chemical liquid within the supply line.

9. The liquid processing apparatus of claim 8, further comprising:

a constant pressure valve that is provided at a more downstream side of the supply line than the at least one processing unit and configured to constantly maintain an internal pressure of the supply line, wherein the degassing unit is provided at a more downstream side of the supply line than the constant pressure valve.

10. The liquid processing apparatus of claim 2, wherein the at least one processing unit is plural in number, and the collecting line comprises:

multiple branch lines that are branched and connected to the processing units, respectively; and a main line that is connected to the branch lines, and the gas supply unit is provided at a more downstream of the main line than the switching valve provided at a branch line connected at the most upstream side of the main line.

11. The liquid processing apparatus of claim 10, wherein the gas supply unit is provided at the main line between the switching valve provided at the branch line connected at the most upstream side of the main line and a switching valve provided at a branch line connected at a downstream side next to the branch line.

12. The liquid processing apparatus of claim 1, wherein the gas supply unit supplies the inert gas from multiple positions along a flow direction of the collecting line.

13. The liquid processing apparatus of claim 1, wherein the gas supply unit supplies the inert gas into the collecting line via the chemical liquid.

* * * * *